United States Patent [19]
Narita

[11] Patent Number: 5,856,241
[45] Date of Patent: Jan. 5, 1999

[54] METHOD OF MANUFACTURING SEMICONDUCTOR DEVICE

[75] Inventor: Kazuhito Narita, Kawasaki, Japan

[73] Assignee: Kabushiki Kaisha Toshiba, Kawasaki, Japan

[21] Appl. No.: 680,401

[22] Filed: Jul. 15, 1996

[30] Foreign Application Priority Data

Jul. 26, 1995 [JP] Japan ..................................... 7-189629

[51] Int. Cl.$^6$ ......................... H01L 21/31; H01L 21/469
[52] U.S. Cl. ........................... 438/758; 430/313; 430/317
[58] Field of Search .................................... 430/313–320; 438/947, 758

[56] References Cited

U.S. PATENT DOCUMENTS 5,066,997  11/1991  Sakurai et al. .
5,374,502  12/1994  Tanaka et al. ........................... 430/322
5,556,805   9/1996  Tanizawa et al. ....................... 438/926
5,578,422  11/1996  Mizuno et al. .......................... 430/313

Primary Examiner—John Niebling
Assistant Examiner—Richard A. Booth
Attorney, Agent, or Firm—Oblon, Spivak, McClelland, Maier & Neustadt, P.C.

[57] ABSTRACT

The present invention provides a method for reducing the size of a semiconductor chip to be manufactured and improving the precision of processing a fine resist pattern provided for manufacturing the semiconductor chip. In particular, to manufacture a semiconductor chip having a small number of regularly-arranged elements, such as those of a memory cell array, the method uses a fine resist pattern which is formed to have regularly arranged opening portions and a dummy region surrounding the opening portions.

9 Claims, 3 Drawing Sheets

① AFTER RESIST DEVELOPMENT

② AFTER HEAT TREATMENT

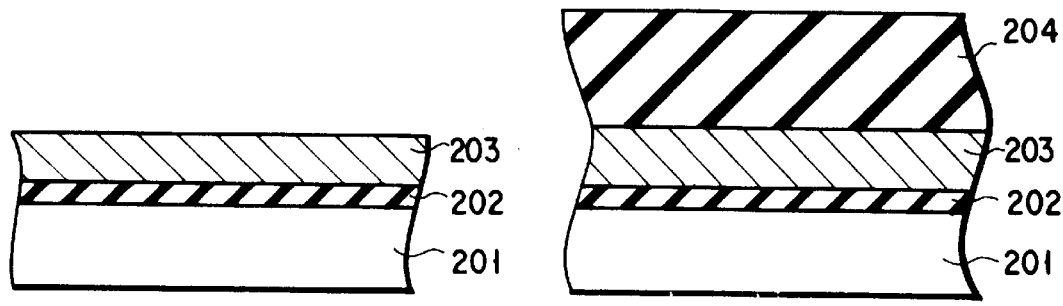
FIG. 5
FIG. 6
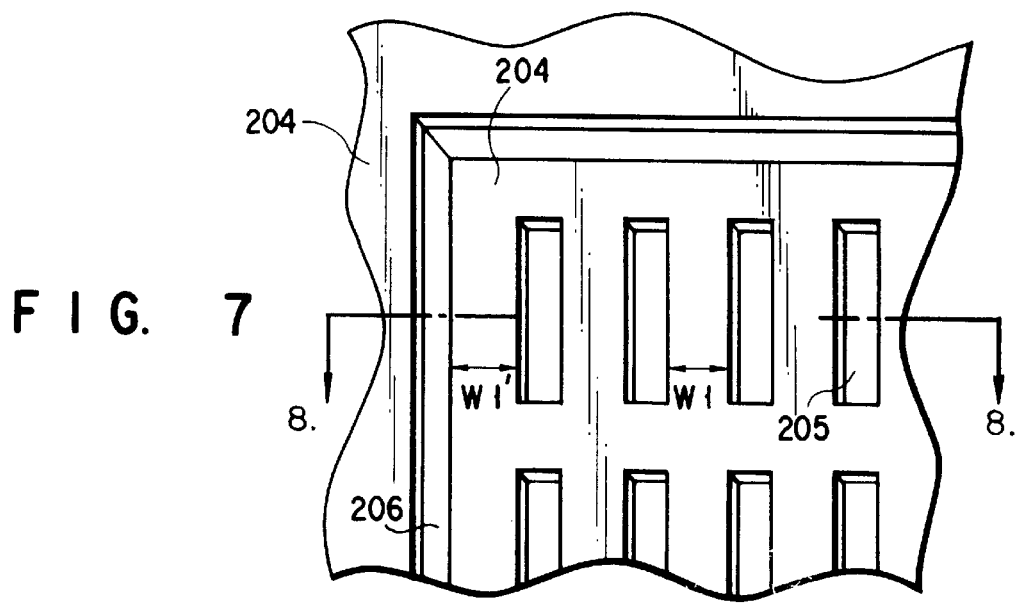
FIG. 7
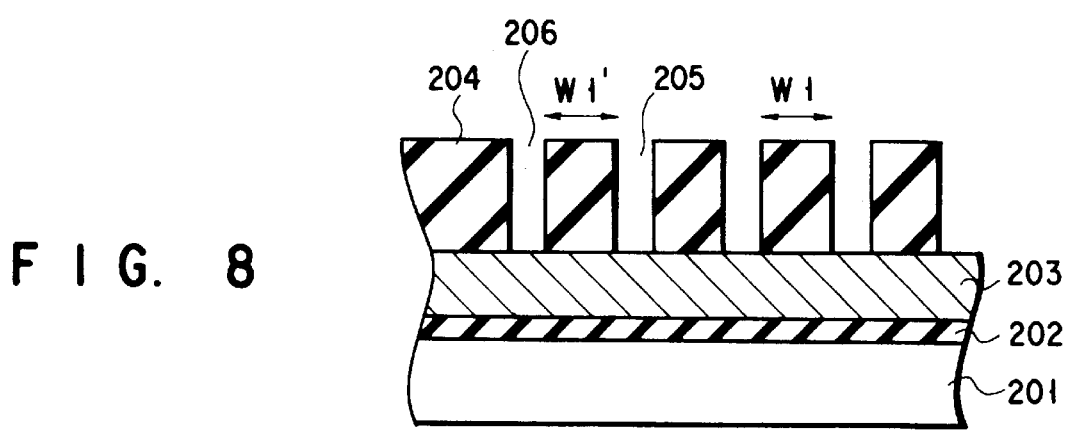
FIG. 8

METHOD OF MANUFACTURING SEMICONDUCTOR DEVICE

BACKGROUND OF THE INVENTION

1. Field of the Invention

The present invention relates to a method of manufacturing a semiconductor device, and in particular to a method using resist patterns each including regularly arranged grooves.

2. Description of the Related Art

In U.S. Pat. No. 5,066,997, a dummy wiring pattern is used to manufacture a memory chip. Furthermore, in general, to manufacture a semiconductor chip having a number of small regularly-arranged elements, such as those of a memory cell array, a pattern having grooves and dummy grooves or consisting of strips and dummy strips has been formed in resist. The grooves or strips are arranged in the central portion of the resist pattern in rows and columns, and separated from each other at a constant distance. The dummy grooves or dummy strips are arranged in a few rows and a few columns, surrounding the grooves or strips. The dummy grooves or dummy strips have the same size and shape as the grooves or strips. They are provided in order to improve the precision of processing the resist. The dummy strips are functional, since the strips are isolated from each other, as shown in FIGS. 1 and 2, which are a plan view and a cross-sectional view, respectively, both showing arrangement of strips 101 formed of resist.

On the other hand, the dummy grooves do not function well for the following reason:

In the resist pattern having grooves, that portion of the resist pattern which surrounds the grooves and the dummy grooves is continuous with that portion of the resist pattern which exists between any two adjacent grooves. Therefore, the latter portion is pulled by the former portion which shrinks as the resist is heated after it has been developed. This disadvantage will be further explained with reference to FIGS. 3, 4A and 4B.

FIG. 3 is a plan view showing a resist pattern having grooves 103 formed in resist 102, and FIG. 4A and 4B are a cross-sectional view of the resist pattern after development and a cross-sectional view of the resist pattern after heat treatment, respectively. As shown in FIG. 3, in the resist 102, a resist portion surrounding the grooves 103 is continuous with resist portions provided between the grooves 103, and has a greater width than each of the resist portions. The resist 102 shrinks as it is heated in order to improve its adhesion. In particular, the surrounding resist portion shrinks considerably, and thus pulls the resist portions as shown in FIG. 4B. Therefore, the resist pattern is deformed even if the dummy grooves are provided. In order to prevent such deformation of the resist pattern, additional dummy grooves must be formed in the resist pattern, inevitably increasing the chip size.

SUMMARY OF THE INVENTION

The object of the present invention is to reduce the size of a semiconductor chip having a number of small regularly-arranged elements, such as those of a memory cell array, and improve the precision of resist processing using resist patterns each of which has grooves arranged in rows and columns.

In order to attain the above object, the present invention is characterized in that a dummy region is provided in the resist pattern in such a manner as to surround the grooves. The dummy region separates the grooves from any other resist pattern provided for manufacturing a semiconductor chip, thereby to prevent the grooves from being deformed when the resist is heated.

Furthermore, the dummy region functions more effectively when the distance between the dummy region and the outermost one of the grooves of each of the rows is equal to or less than the distance at which the grooves of each row are separated from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 5 is a cross-sectional view for showing a method of the present invention for manufacturing a semiconductor device.

FIG. 6 is a cross-sectional view for showing a step of a method of the present invention for manufacturing a semiconductor device.

FIG. 7 is a plan for showing a step of the method of the present invention.

FIG. 8 is a cross-sectional view for showing a step of the method of the present invention.

DETAILED DESCRIPTION OF THE PREFERRED EMBODIMENT

Figure 1:
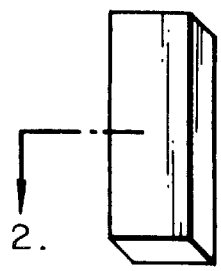
FIG. 1 is a plan view for illustrating a step of a conventional method for manufacturing a semiconductor device.
Figure 1:
Figure 1:
Figure 2:
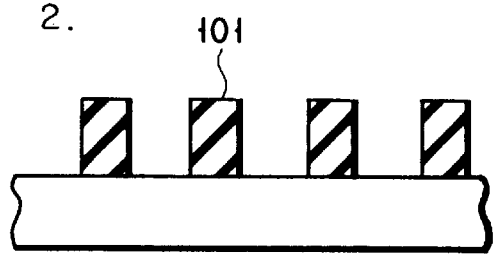
FIG. 2 is a cross-sectional view for showing the step of the conventional method.
Figure 3:
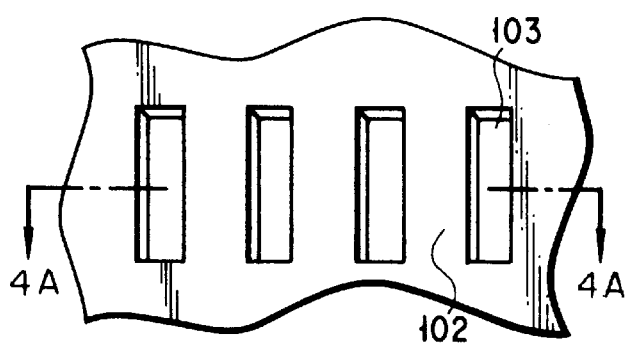
FIG. 3 is a plan view for showing a step of the conventional method.
Figure 4A:
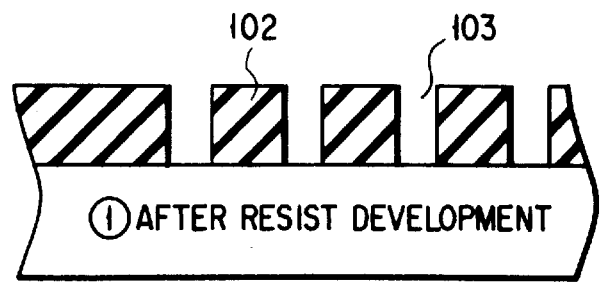
FIG. 4A is a cross-sectional view for showing a step of the conventional method.
Figure 4B:
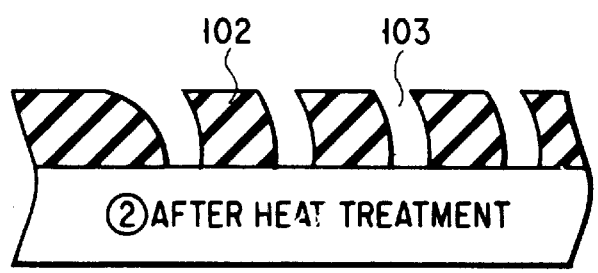
FIG. 4B is a cross-sectional view for showing a step of the conventional method.

The embodiment of the present invention will be explained with reference to FIGS. 5 to 8.

A silicon oxide film 202 is formed on a semiconductor substrate 201 to have a thickness of, e.g. 20 nm. As shown in FIG. 5 which is a cross-sectional view, a polysilicon film 203 having a thickness of, e.g. 100 nm, is formed on the silicon oxide film 202 on the semiconductor substrate 201. Next, a general lithography processing is performed to form grooves in the polysilicon film 203.

More specifically, the polysilicon film 203 is coated with positive resist 204 (e.g. a mixture of cresol novolac resin and naphtoquinone diazide compound) (See FIG. 6). A photomask is provided on the positive resist 204, and ultraviolet rays (e.g. so-called g rays having a wavelength of 436 nm or so-called i rays having a wavelength of 365 nm) are radiated onto the photomask and the positive resist 204. The pattern of the photomask has groove regions 205 (first grooves) and a dummy region 206 (second groove) surrounding the groove regions 205 (See FIG. 7). The groove regions 205 are arranged in rows and columns, and the groove regions 205 of each of the rows are separated from each other at a constant distance. Thus, when the positive resist 204 is developed by a developing solution (e.g., an organic alkali such as tetramethyl-ammonium-hydroxide or choline) for positive resist (See FIG. 8), a resist pattern is formed to have a dummy region 206 and grooves 205 which correspond to the dummy region 206 and groove regions 205 of the photomask, respectively. The grooves 205 are formed in rows and columns such that the grooves 205 of each of the rows are separated from each other at a constant distance. In other words, that portion of the resist pattern which exists between any two adjacent grooves 205 has a width W1. The dummy region 206 is separated from the outermost one of the grooves 205 of each row at a distance which is equal to or less than the above constant distance. In other words, that portion of the resist pattern which exists between the dummy region 206 and said outermost one of the grooves 205 has a width W1' which is equal to or less than the width W1 (W1'≦W1) (See FIG. 7). Furthermore, as may be understood from the above, the developed resist 204 comprises an outer resist portion surrounding the dummy region 206 and an inner resist portion surrounded by the dummy region 206. The outer resist portion has a width greater than the width W1.

Next, heat treatment is performed, e.g. at a temperature of 100° C. or more, to improve the adhesion of the resist 204 to the polysilicon film 203, and solidify the resist 204 for the purpose of improving the RIE (Reactive Ion Etching) tolerance of the resist 204. At this time, the outer resist portion is shrunk and deformed due to the heat treatment. To be specific, the outer resist portion is shrunk considerably. On the other hand, the inner resist portion is not influenced by shrinkage of the outer resist portion. This is because the dummy region 206 separates the inner resist portion from the outer resist portion.

Figure 9A:
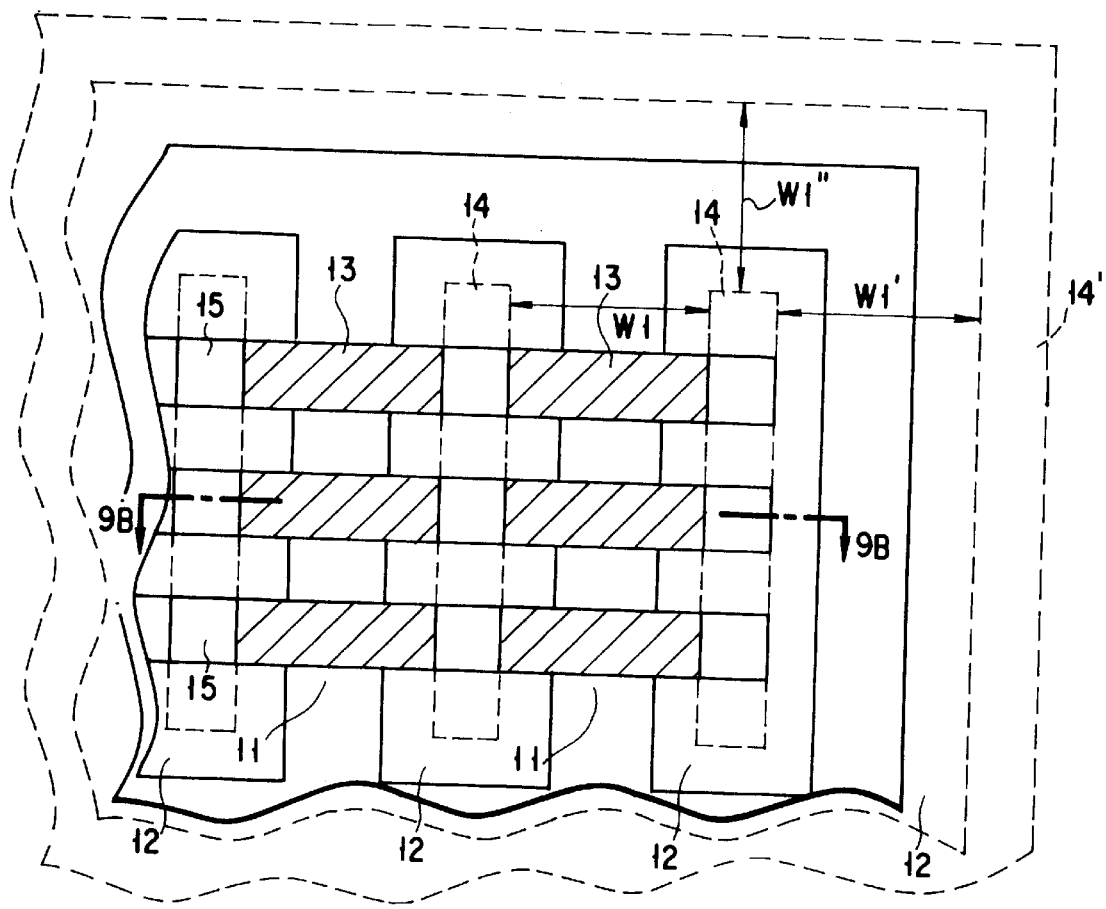
FIG. 9A is a plan view of memory cells of a nonvolatile memory device manufactured according to the method of the present invention.
Figure 9B:
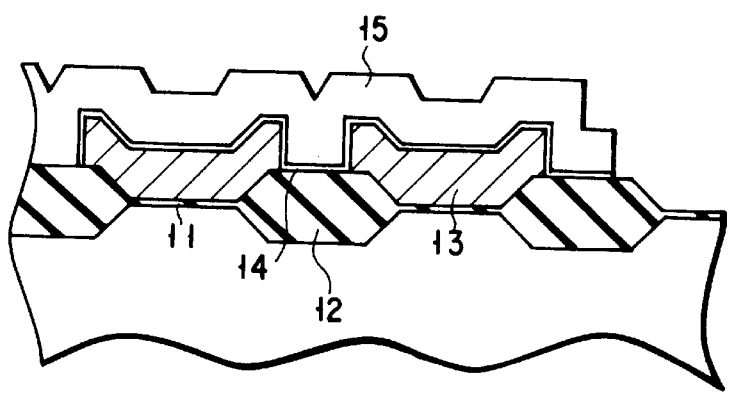
FIG. 9B is a cross-sectional view partially showing the memory cells of FIG. 9A.

FIG. 9A is a flat view of memory cells of a nonvolatile memory device manufactured according to the method of the present invention. FIG. 9B is a cross-sectional view partially showing the memory cells of FIG. 9A. In FIGS. 9A and 9B, 11 denotes a channel region, 12 denotes an element separation region, 13 denotes a floating gate, 14 denotes a groove for use in a floating gate formation processing, 14' denotes a dummy groove for use in the floating gate formation processing, and 15 denotes a control gate formed on the floating gate 13 and a portion of the element separation region 12. The pattern 14 corresponds to the groove 205 shown in FIG. 7, and the dummy groove 14' corresponds to the dummy region 206 in FIG. 7. It is ideal that as shown in FIG. 9A, a distance W1 between any adjacent patterns 14 is equal to a distance W1' between the dummy groove 14' and the outermost one of the patterns 14 in a longitudinal direction thereof and a distance W1" between the dummy groove 14' and said outermost one of the patterns 14 in a transverse direction thereof.

According to our experiment, in a resist pattern having no dummy region and a resist pattern in which grooves each having a width of 0.4 μm and a length of 15 μm are regularly arranged, ten grooves are pulled and deformed by that portion of the resist which is shrunk due to heat. On the other hand, the shrunk portion has no effect on any of the grooves of a resist pattern having a dummy region.

In the present invention, the resist pattern, as explained above, has grooves and a dummy region surrounding the grooves. By virtue of such a feature, the grooves are not deformed by that portion of the resist which is shrunk due to heat treatment performed after development of the resist. Thus, the resist pattern is considerably accurately processed. Therefore, this technique is advantageous to processing a resist pattern which is formed such that grooves are regularly arranged in order to manufacture a semiconductor chip which has a number of small regularly-arranged elements, such as those of a memory cell array.

The present invention has been explained by referring to the above embodiment. However, various modifications may be made without departing from the spirit or scope of the general inventive concepts as defined by the appended claims and their equivalents.

For example, the positive resist is used in the above embodiment. However, negative resist may be used which is represented by polyisoprane and bisazide compound of sensitive material, in place of the positive resist. When the negative resist is used, a photomask is used which has a pattern reverse to that of the photomask for the positive resist.

To summarize, according to the present invention, the grooves of the resist pattern are not deformed by that portion of the resist which is shrunk due to the heat treatment of the lithography, and the accuracy with which the resist pattern is processed is improved. In addition, the number of dummy regions to be provided can be decreased as far as possible. By virtue of these features, a semiconductor chip can be manufactured which is small in size.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, the method comprising the steps of:

forming a resist layer on a semiconductor substrate having a regular pattern of first grooves, and forming a second groove to surround said regular pattern of first grooves.

2. A method according to claim 1, wherein said first and second grooves are formed in a same plane.

3. A method according to claim 1, wherein edges of said second groove have rectangular shapes.

4. A method according to claim 3, wherein a width of a space between said first grooves is not less than a width of a space between an outermost edge of said first grooves and an inner edge of said second groove.

5. A method of manufacturing a semiconductor device, comprising:

coating a surface of a semiconductor substrate with resist; and opening the resist by use of predetermined pattern which comprises a central pattern and a dummy pattern surrounding the central pattern, the central pattern being configured to form grooves in the resist which are regularly arranged in rows and columns and the dummy pattern being configured to form a surrounding groove in the resist.

6. The method according to claim 5, wherein the semiconductor substrate is one of a semiconductor substrate on which no film is formed and a semiconductor substrate on which a film is formed.

7. The method according to claim 5, wherein the grooves of each of the rows of the pattern are separated from each other at a constant distance, and a distance between the dummy pattern and the outermost one of the grooves of said each row of the pattern is equal to or less than the constant distance.

8. The method according to claim 5, comprising using one of positive resist and negative resist.

9. The method according to claim 5, comprising performing heat treatment on the semiconductor substrate at 100° C. or more after the step of opening the resist.

* * * * *